(12) United States Patent
Jacobowitz et al.

(10) Patent No.: US 7,501,865 B1
(45) Date of Patent: Mar. 10, 2009

(54) METHODS AND SYSTEMS FOR A DIGITAL FREQUENCY LOCKED LOOP FOR MULTI-FREQUENCY CLOCKING OF A MULTI-CORE PROCESSOR

(75) Inventors: Lawrence Jacobowitz, Wappingers Falls, NY (US); Daniel J. Stigliani, Jr., Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/873,462

(22) Filed: Oct. 17, 2007

(51) Int. Cl.
*H03L 7/06* (2006.01)

(52) U.S. Cl. ............ 327/147; 327/156; 327/158; 327/159

(58) Field of Classification Search ........... 327/147, 327/158; 372/18
See application file for complete search history.

(56) References Cited

U.S. PATENT DOCUMENTS

| | | | |
|---|---|---|---|
| 5,086,387 A | 2/1992 | Arroyo et al. | |
| 7,002,415 B2 | 2/2006 | Tsyrganovich | |
| 7,061,944 B2 * | 6/2006 | DeCusatis et al. | ............ 372/18 |
| 7,152,186 B2 | 12/2006 | Airaud et al. | |
| 2006/0282692 A1 | 12/2006 | Oh | |

FOREIGN PATENT DOCUMENTS

JP 2004234182 8/2004

OTHER PUBLICATIONS

U.S. Appl. No. 11/734,375, filed Apr. 12, 2007.
U.S. Appl. No. 11/734,334, filed Apr. 12, 2007.
U.S. Appl. No. 11/747,300, filed May 11, 2007.

* cited by examiner

*Primary Examiner*—Kenneth B Wells
*Assistant Examiner*—John W Poos
(74) *Attorney, Agent, or Firm*—Cantor Colburn LLP; Joseph Biela

(57) ABSTRACT

A method and systems for a digital frequency locked loop in a multi-core processor are provided. The method includes applying a dither modulation signal at a dither modulation frequency to modulate an output frequency to provide a clock signal to a core of the multi-core processor. The method further includes filtering a feedback signal of the output frequency with respect to a target frequency. The method additionally includes determining a frequency error in the filtered feedback signal as a function of alignment of the output frequency to the target frequency, and adjusting the output frequency in response to the frequency error.

20 Claims, 7 Drawing Sheets

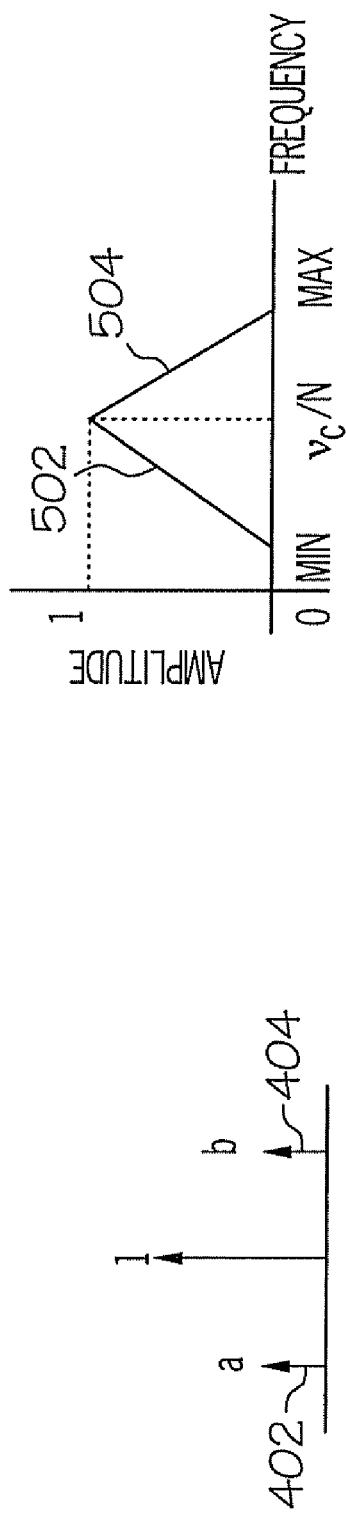
FIG. 5
FIG. 4
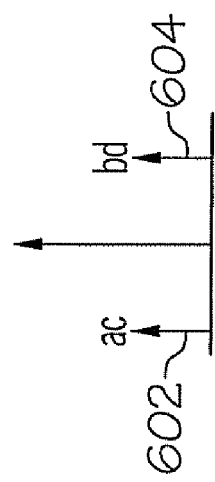
FIG. 6

METHODS AND SYSTEMS FOR A DIGITAL FREQUENCY LOCKED LOOP FOR MULTI-FREQUENCY CLOCKING OF A MULTI-CORE PROCESSOR

CROSS-REFERENCE TO RELATED APPLICATIONS

This application contains subject matter related to the subject matter of the following co-pending application, which is hereby incorporated herein by reference in its entirety: U.S. patent application Ser. No. 11/873,458, entitled METHODS AND SYSTEMS FOR DIGITALLY CONTROLLED MULTI-FREQUENCY CLOCKING OF MULTI-CORE PROCESSORS, filed on Oct. 17, 2007.

BACKGROUND OF THE INVENTION

The present disclosure relates generally to computer system clocking, and, in particular, to a digital frequency locked loop for multi-frequency clocking in a multi-core processor system.

Existing clock distribution trees are impractical to design, fabricate and yield for microprocessors including a large numbers of processing cores in newly emerging multi-core micro-architectures which are increasing processor speed to gain additional performance. Complementary metal oxide semiconductor (CMOS) gate-leakage power or passive power is increasingly dominating power dissipation in fast microelectronic circuits on chips made in 65 nm technology and smaller lithography. Reduction of heat is a major industry concern, and, begins with microprocessor chips in computer systems, such as servers populating data centers. Controlling operating frequencies of individual microprocessor cores and chips can reduce overall power consumption and heat dissipation while optimizing performance. Typical computer system clocking schemes utilize a master oscillator to generate a system clock signal, which is distributed as a clock tree. As the number of processing cores in multi-core processing systems continues to grow, it would be beneficial to minimize clock tree lines and replace high speed clock distribution nets with local core clocking.

In distributing and stepping up or down clock signals, some computer systems employ one or more phase locked loops (PLLs). PLLs typically operate on a feedback loop mechanism that attempts to minimize the phase difference between the reference signal and the scaled clock signal, thereby phase aligning the two signals. While PLLs can be effective, they have a number of shortcomings. For example, a PLL can lock onto harmonics of the reference clock frequency, rather than the reference clock frequency itself. PLLs can suffer from common phase-noise and susceptibility to jitter and skew, known as "skitter". Capture, lock, and voltage fluctuations may destabilize PLLs. Additionally, PLLs typically rely on a single point solution, where a control circuit attempts to drive phase-error to a null or zero value, which can increase the chance of a false lock while also requiring a continuous reference clock to maintain a lock and generate an output clock. Therefore, it would be beneficial to develop an approach to perform multi-frequency clocking in a computer system that supports a variety of frequencies while avoiding issues associated with PLLs. Accordingly, there is a need in the art for a digital frequency-locked loop to generate a stable local core clock for multi-core processors.

BRIEF SUMMARY OF THE INVENTION

Embodiments of the invention include a method for a digital frequency locked loop in a multi-core processor. The method includes applying a dither modulation signal at a dither modulation frequency to modulate an output frequency to provide a clock signal to a core of the multi-core processor. The method further includes filtering a feedback signal of the output frequency with respect to a target frequency. The method additionally includes determining a frequency error in the filtered feedback signal as a function of alignment of the output frequency to the target frequency, and adjusting the output frequency in response to the frequency error.

Additional embodiments include a system for a digital frequency locked loop in a multi-core processor. The system includes a dither modulator signal to provide dither modulation at a dither modulation frequency to a voltage bias. The system further includes a voltage controlled oscillator receiving the voltage bias and generating an output frequency to provide a clock signal to a core in the multi-core processor. The system additionally includes a feedback path to calculate a frequency error between the output frequency and a target frequency, where the voltage bias is modified to compensate for the frequency error.

Further embodiments include a system for a digital frequency locked loop in a multi-core processor. The system includes a dither modulator to generate a dither modulation frequency. The system also includes error-signal decision logic to control mixing a digital correction signal with the dither modulation frequency to produce an output frequency, where the output frequency provides a clock signal to a core in the multi-core processor. The system additionally includes a feedback path isolating frequency content of the output signal with respect to a target frequency, where the isolated frequency content is input to the error-signal decision logic to reduce frequency error between the output signal and the target frequency.

Other systems and/or methods according to embodiments will be or become apparent to one with skill in the art upon review of the following drawings and detailed description. It is intended that all such additional systems and/or methods be included within this description, be within the scope of the present invention, and be protected by the accompanying claims.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4 depicts an exemplary frequency spectrum of a clock signal as determined in a feedback path of a frequency locked loop;

FIG. 5 depicts an exemplary bandpass filter applied in a feedback path of a frequency locked loop;

FIG. 6 depicts an exemplary output of the bandpass filter of FIG. 5 applied in a feedback path of a frequency locked loop;

The detailed description explains the preferred embodiments of the invention, together with advantages and features, by way of example with reference to the drawings.

DETAILED DESCRIPTION OF THE INVENTION

Exemplary embodiments provide methods and systems for a digital frequency locked loop (FLL) to support multi-frequency clocking in a multi-core processor system. A "digital FLL" refers to applying digital signal processing and/or digital control logic to an FLL. An FLL employs a closed loop feedback control technique to maintain a desired output frequency. In exemplary embodiments, an FLL uses output of a digital frequency filter to equalize two sideband signals, which directly indicates if the clock frequency is too high or too low, rather than a phase error signal that is minimized in a phase locked loop (PLL). Unlike a PLL, an FLL will not lock onto harmonics of a reference frequency. Using an FLL enables a clock distribution system with a low-speed reference clock provided to a microprocessor chip to control the high frequency target clock. This is advantageous, since propagating high-speed clocks over long distances may be an inhibitor for microprocessor chip size, complexity, and speed. The use of a digital filter approach also allows different filter characteristics to be used in different parts of a microprocessor chip, providing a method for creating different core clocking frequencies in a multi-core microprocessor chip.

Figure 1:
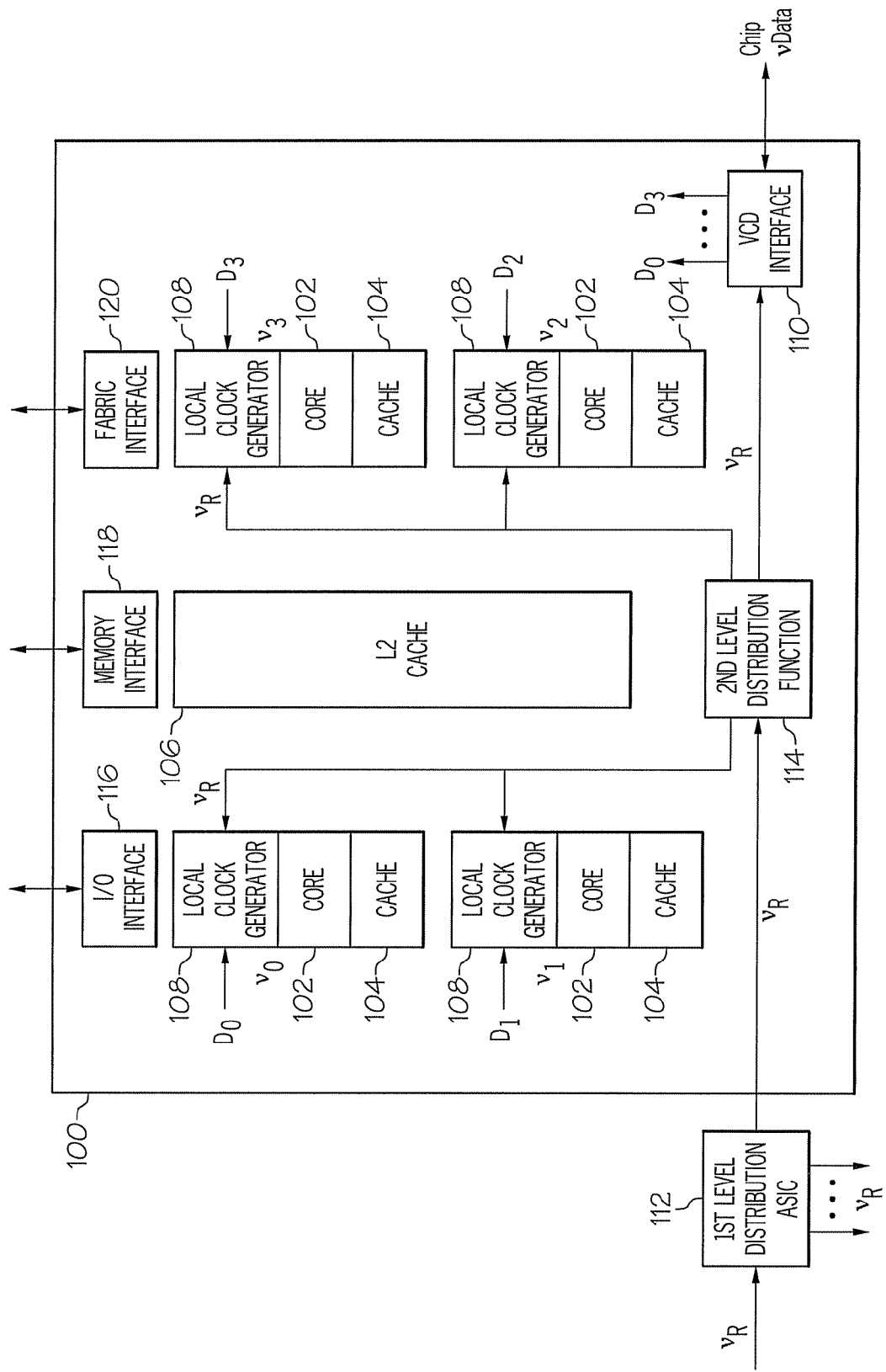
FIG. 1 depicts multi-frequency clocking of a multi-core processor chip in accordance with exemplary embodiments.

Turning now to the drawings, it will be seen that in FIG. 1 there is a block diagram of a microprocessor (μP) chip 100 upon which a digital FLL is implemented to support multi-frequency core clocking in exemplary embodiments. The μP chip 100 of FIG. 1 includes four cores 102. The cores 102 provide independent processing engines, enabling parallel processing within the μP chip 100. Each core 102 can access a local cache 104, paired with the core 102, and a level-2 cache 106 shared between the cores 102. Independent digitally controlled local clock generators 108 are used to clock each core 102 and local cache 104 pair synchronously, such that each core 102 can operate asynchronously to other cores 102 in the μP chip 100. In exemplary embodiments, the clock generators 108 are each digitally controlled using an FLL, with a clock frequency as determined by frequency data distributed via a vital chip data (VCD) interface function 110 in the μP chip 100. The VCD data is also referred to as "vData". The VCD interface function 110 may include memory, registers or other storage elements capable of storing short-term or long-term VCD data. The VCD interface 110 provides a routing mechanism to the clock generators 108 and can also forward data from an external source, such as nonvolatile memory (e.g., an off-chip serial electrically erasable programmable read-only memory). Each core 102 may have different frequency settings that can be optimized to reduce power consumption and heat dissipation at each core 102 while maintaining a desirable level of performance. The frequency settings may be organized as one or more tables, enabling selection of higher frequencies for increased performance as a function of power dissipation, and vice versa. Power dissipation may be determined as a function of voltage at given temperatures. A system reference oscillator clock frequency ($v_R$) that is used to gate digital data into the VCD interface function 110 and also into the individual clock generators 108 may pass through both an external and internal distribution function relative to the μP chip 100, such as a first level distribution application specific integrated circuit (ASIC) 112 and a second level distribution function 114. The clock generator 108 output frequency (depicted as core clock frequencies $v_0$, $v_1$, $v_2$, and $v_3$) can be adjusted to operate at an optimum point for each core 102 (e.g., maximum performance, lowest power), which may be above or below the mean operating frequency of total processor machine population for a larger system in which the μP chip 100 is incorporated. It should be noted that the system reference oscillator clock frequency ($v_R$) is not directly synchronized to the core clocks but is used to load the appropriate data only. This is unlike a PLL, which directly compares to a reference signal.

In exemplary embodiments, the reference oscillator clock frequency ($v_R$) is a relatively low frequency such that it can be easily routed throughout a multi-chip module (MCM) or a printed circuit (PC) board without significant signal degradation, yet fast enough for clock synchronization updates sufficient to insure that the clock generators 108 are stable and remain within the a deviation range of approximately 10-100 ppm (parts per million) across the computer system. For example, the reference oscillator clock frequency ($v_R$) may be approximately 10-100 MHz to provide a reference frequency to the clock generators 108 running at frequencies ranging from approximately 5 to 10 GHz. The distribution of clock signals can be point-to-point for improved reference clock integrity but may be multi-drop for lower performance and lower cost configurations. Using a slower frequency clock to digitally command a local higher frequency clock may reduce issues associated with routing high frequency analog signals over long distances, such as skin effect, media and connector loss, crosstalk, termination mismatches, and the like.

While only four cores 102 are depicted within the μP chip 100, it will be understood that any number of cores 102 can be included within the scope of the invention. Since all of the cores 102 may be running asynchronously to the common cache 106, as well as other memory, a level of buffering can be provided between the cores 102 and the level-2 cache 106 to accommodate the asynchronous nature of the interface. The μP chip 100 need not include separate caches 104 for each core 102 or the level-2 cache 106 as depicted in FIG. 1. Each clock generator 108 may also include a bypass mode to allow the master reference oscillator 112 or another core's clock generator 108 to be used in the event that a given clock generator 108 circuit fails, thereby providing a backup clock. The μP chip 100 may additionally include support interfaces for integrating the μP chip 100 into a larger computer system, such as an I/O interface 116, a memory interface 118, and a fabric interface 120. The I/O interface 116 and the memory interface 118 provide interfaces to communicate with a variety of input and/or output devices or systems, as well as memory devices or subsystems using communication and bus standards known in the art. The fabric interface 120 can be used to interconnect multiple μP chips 100 together to construct a larger multi-processor system, forming one or more multi-chip modules (MCMs), and supporting a symmetric multi-processing (SMP) configuration. In an SMP configuration, memory is coherent to μP chips 100 within an SMP system.

Figure 2:
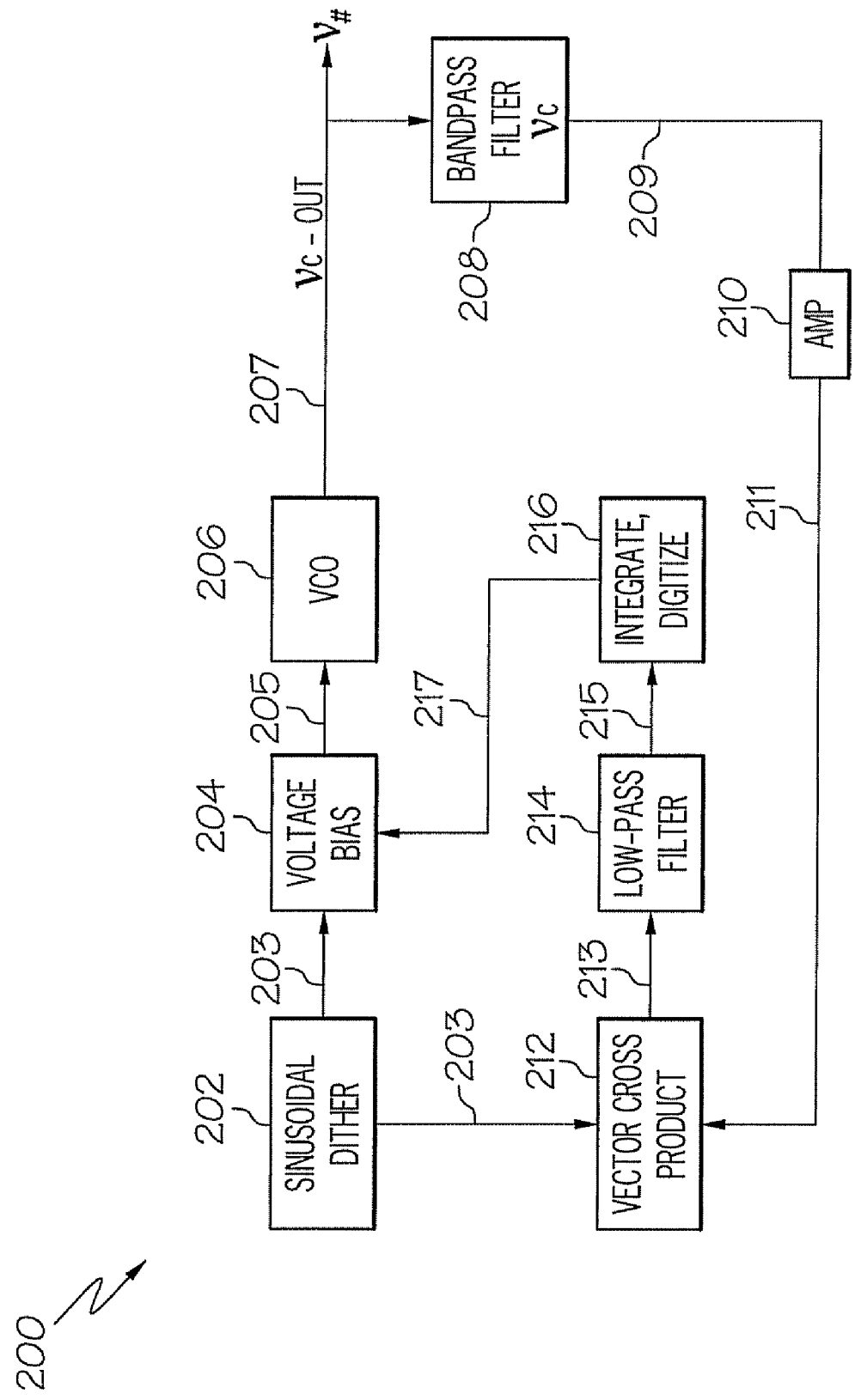
FIG. 2 depicts a generalized block diagram of a frequency locked loop in accordance with exemplary embodiments.

Turning now to FIG. 2, a generalized block diagram 200 of an FLL local clock generator circuit is depicted for generating and maintaining a desired output frequency. The block diagram 200 represents an exemplary embodiment of an FLL that can be employed by the local clock generators 108 of FIG. 1 to establish and maintain a target frequency ($v_c$). A sinusoidal dither modulator 202 provides a dither modulation signal 203 at a dither modulation frequency to a voltage bias block 204. The dither modulation frequency is generally much lower than the clock target frequency ($v_c$), e.g., several kilohertz, such that it can be detected as sideband signals, and not interfere with the target clock operating frequency ($v_c$). The voltage bias block 204 supplies an input voltage 205 to a voltage-controlled oscillator (VCO) 206 to produce an output frequency ($v_{c\_out}$). The output frequency ($v_{c\_out}$) of the VCO 206 is set or changed in response to the input voltage 205 supplied to the VCO 206. The oscillation of the dither modulation frequency passing through the voltage bias block 204 to the VCO 206 results in dither modulation of the output frequency ($v_{c\_out}$) on output clock signal 207. Dither modulation appears as a relatively small slowly moving variation in the output frequency ($v_{c\_out}$). In exemplary embodiments, the output frequency ($v_{c\_out}$) on the output clock signal 207 is used to clock an individual core 102 and local cache 104, as one of the local clock generators 108 of FIG. 1, where $v_{c\_out}$ can map to $v_0$, $v_1$, $v_2$, or $v_3$ ($v_\#$ generically) based on the individual core "vData". To support changing the output frequency ($v_c\_$Out) of the VCO 206, as well as maintaining a desired frequency, a feedback loop is employed to track frequency error. A bandpass filter 208 may be used to filter on the desired target frequency ($v_c$) with sidebands and to remove harmonics and noise, where the target frequency ($v_c$) represents the center frequency of the bandpass filter 208. In exemplary embodiments, the center frequency of the bandpass filter 208 is adjustable to support changes to the target frequency ($v_c$). In alternate exemplary embodiments, the bandpass filter 208 is in the forward/output path of the output clock signal 207.

A filtered feedback signal 209 is output from the bandpass filter 208 and may be further amplified using an amplifier 210. The amplifier 210 may increase the dynamic range of the feedback path and/or perform signal rescaling prior to further analysis. Amplified output 211 of the amplifier 210 is input to a vector cross product function 212. In exemplary embodiments, the vector cross product function 212 calculates a vector cross product signal 213 of the modulation signal 203 and the amplified output 211. The vector cross product signal 213 includes frequency components at the sum and difference of the dither and filtered feedback frequencies. The vector cross product signal 213 may be filtered via a lowpass filter 214, with filtered output 215 integrated and digitized over a period of time via integrate and digitize function 216. The integrate and digitize function 216 produces an averaged frequency error signal 217 that can be positive or negative depending upon whether there is a misalignment between the target frequency ($v_c$) and the output frequency ($v_{c\_out}$). The output of the integrate and digitize function 216 may be input into the voltage bias block 204 to further modify the input voltage supplied to the VCO 206 to compensate for the frequency error.

When there is a misalignment between the target frequency ($v_c$) and the output frequency ($v_{c\_out}$), the averaged frequency error signal 217 is a signed signal at either a first polarity (e.g., $v_{c\_out}<v_c$) or a second polarity (e.g., $v_{c\_out}>v_c$). In exemplary embodiments, when the output frequency ($v_{c\_out}$) is equivalent to the target frequency ($v_c$), the averaged frequency error signal 217 is zero. The averaged frequency error signal 217 is input to the voltage bias 204 to respectively increase or decrease the output frequency ($v_{c\_out}$) in such a way that the output frequency ($v_{c\_out}$) moves closer to the target frequency ($v_c$). For the case when the target frequency ($v_c$) and the output frequency ($v_{c\_out}$) are aligned, the filtered feedback signal 209 includes a characteristic frequency that is twice the dither modulation frequency. Consequently, this maintains the output of the voltage bias 204 (i.e., input voltage 205) at its current value ($v_{c\_out}=v_c$), as the averaged frequency error signal 217 from the cross product of the dither modulation frequency and double the dither modulation frequency is zero. It will be understood that a tolerance band may be applied to determine whether $v_{c\_out}=v_c$.

Figure 3:
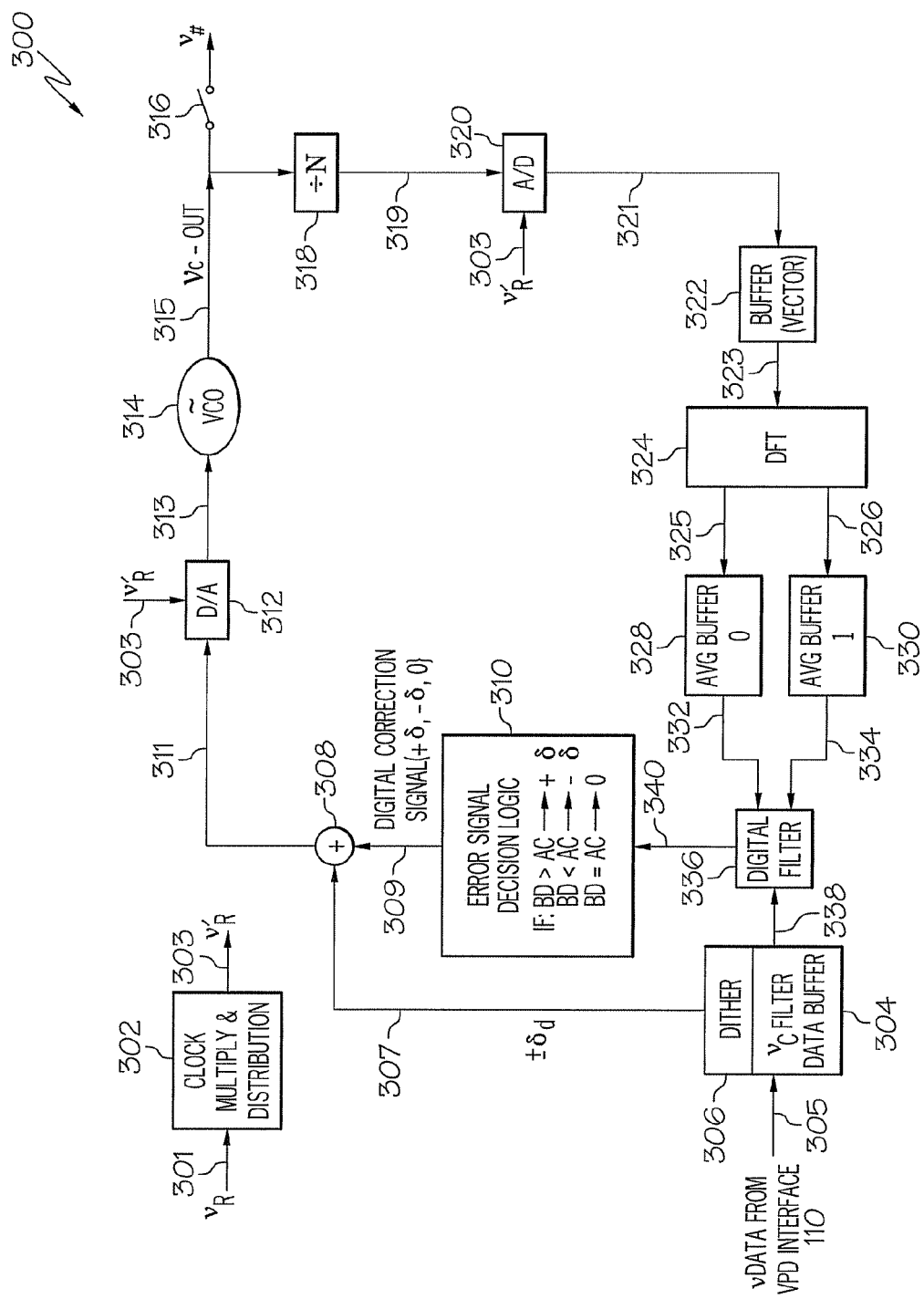
FIG. 3 depicts a digitally controlled frequency locked loop in accordance with exemplary embodiments.

Turning now to FIG. 3, a digitally controlled FLL 300 is depicted in accordance with exemplary embodiments. The FLL 300 represents another embodiment of a local clock generator 108 of FIG. 1. Although various elements of the FLL 200 of FIG. 2 can be implemented digitally, the FLL 300 of FIG. 3 depicts a digital feedback control loop using digital decision logic for frequency error correction. The FLL 300 includes additional digital signal processing and control elements to adjust an output frequency ($v_{c\_out}$) and establish a frequency lock on target frequency ($v_c$). The output frequency ($v_{c\_out}$) may be used to clock an individual core 102 and local cache 104, as one of the local clock generators 108 of FIG. 1, where $v_{c\_out}$ can map to $v_0$, $v_1$, $v_2$, or $v_3$ ($v_\#$ generically). Unlike a PLL, the FLL 300 does not directly scale up or attempt to lock directly on the reference oscillator clock frequency ($v_R$), which may originate from off-chip as depicted in FIG. 1; rather, the reference oscillator clock frequency ($v_R$) provides a reference clock for digital elements of the FLL 300.

In exemplary embodiments, a clock multiply and distribution block 302, which is contained within the FLL 300, creates a multiple of the reference oscillator clock frequency ($v_R$) as digital element clock frequency ($v'_R$) via reference clock input signal 301 and reference clock output signal 303 respectively. For example, the reference oscillator clock frequency ($v_R$) may be a relatively low frequency, e.g., 10-100 MHz, while the digital element clock frequency ($v'_R$) is a relatively high frequency, e.g. 0.1-1 GHz. Referencing the digital elements using a slower frequency external reference oscillator may simplify synchronization of multiple FLLs 300 producing localized high frequency clocks (e.g., $v_0$, $v_1$, $v_2$, and $v_3$) in the local clock generators 108 of FIG. 1. In alternate exemplary embodiments, the digital element clock frequency ($v'_R$) is generated locally, independent of the reference oscillator clock frequency ($v_R$).

The FLL 300 may also receive configuration data, such as vData from the VCD interface function 110, as depicted in FIG. 1. In exemplary embodiments, configuration data to set the target frequency ($v_c$) for the specific FLL 300 is stored in $v_c$ filter data buffer 304, as received via VPD input signal 305. The $v_c$ filter data buffer 304 may also include configuration information for setting a dither modulation frequency ($\pm\delta_d$) for a dither modulator 306. In alternate exemplary embodiments, the dither modulation frequency ($\pm\delta_d$) of the dither modulator 306 is not directly programmable. The dither modulation frequency is generally much lower than the target frequency ($v_c$), e.g., several kilohertz, such that it can be detected but not interfere with circuits operating at the target frequency ($v_c$).

The dither modulator 306 outputs a dither modulation signal 307 at the dither modulation frequency ($\pm\delta_d$) as a bipolar frequency to a combiner 308. The combiner 308 also receives a digital error correction signal 309 from error-signal decision logic 310. The error-signal decision logic 310 always retains the prior value of the correction signal (setup value) so that it may be modified incrementally. The digital error correction signal 309, as output from the error-signal decision logic 310, includes the prior digital frequency setup value modified by a new correction increment (+δ0, −δ, or 0). The error-signal decision logic 310 produces a frequency offset in predefined frequency steps (+δ, −δ, or 0) to shift the output frequency ($v_{c\_out}$) accordingly, for example, ±100 MHz steps. The combiner 308 outputs a digital modulated signal 311 to a digital-to-analog (D/A) converter 312. The D/A converter 312 provides an analog input voltage 313 for a VCO 314. The VCO 314 responds to the analog input voltage 313, producing the output frequency ($v_{c\_out}$) on an output clock signal 315. The output clock signal 315 may be directly or indirectly connected to one or more pairs of the cores 102 and local caches 104 of FIG. 1 for high-speed local clocking. The output frequency ($v_{c\_out}$) may pass through a switch 316, which can be used to control whether circuitry external to the FLL 300 receives the output frequency ($v_{c\_out}$). For example, opening the switch 316 may prevent a core 102 and local cache 104 of FIG. 1 from receiving the output frequency ($v_{c\_out}$), which can lower overall power consumption in the μP chip 100 of FIG. 1. It will be understood that additional switches 316 can be placed in the FLL 300 at different locations in the forward and/or feedback path within the scope of the invention. Placing the switch 316 external to the feedback loop of the FLL 300 may allow for rapidly outputting the output frequency ($v_{c\_out}$) at the target frequency ($v_c$) when the switch 316 is closed, e.g., after establishing a frequency lock while the switch 316 is open.

In the feedback path of the FLL 300, the output frequency ($v_{c\_out}$) is slowed using a frequency divider 318 to lower the output frequency by a factor of "N", placing scaled output frequency ($v_{c\_out}/N$) in a useable range of an analog-to-digital (A/D) converter 320 via scaled feedback signal 319. The A/D converter 320 produces discretized samples in time and amplitude, which are passed via an A/D converter output signal 321 as a vector for frequency domain analysis in buffer 322. Additional signal processing may be performed to normalize for effects associated with the A/D converter 320, e.g., range normalization or bias removal. In exemplary embodiments, the buffer 322 accumulates a sufficient number of samples to perform frequency analysis using a discrete Fourier transform (DFT) function 324, passing samples to the DFT function 324 via signal path 323. The number of samples required to perform the DFT function 324 efficiently can vary based upon the underlying DFT calculation technique employed. For example, computational efficiency can vary based on the number of samples held in the buffer 322 or number of frequency bins desired, which may enable the use of fast Fourier transform (FFT) techniques with varying radix values. In exemplary embodiments, the DFT function 324 produces frequency bins as magnitude values representing the frequency content at a scaled target frequency ($v_c/N$) and the lower and upper side bins 402 and 404 as depicted in FIG. 4. The magnitude values of the side bins 402 and 404 of FIG. 4 are referred to as "a" and "b" respectively. Coefficients used to calculate frequency information in the DFT function 324 may be programmable, and can be provided externally from the VPD interface function 110 of FIG. 1. In alternate exemplary embodiments, other techniques to calculate frequency content are employed, such as a discrete cosine transform (DCT) or discrete wavelet transform (DWT). Using the DFT function 324, the frequency content of the output frequency ($v_{c\_out}$) can be decomposed into multiple spectral components.

The output of the DFT function 324 may be sent to one of two averaging buffers 328 and 330 via signal paths 325 and 326 respectively. The two averaging buffers 328 and 330 are utilized in a "ping-pong" configuration, where one of the averaging buffers 328 or 330 is filled while processing is performed on the other. The averaging buffers 328 and 330 may reduce the total data volume to average values, reducing noise effects as well as temporary glitch effects in achieving a frequency lock. In alternate exemplary embodiments, the averaging buffers 328 and 330 are combined into a single averaging buffer, with pointer values used to manage addition and removal of data. Average signal outputs 332 and 334 provide a path from each of the averaging buffers 328 and 330 to a digital filter 336.

In exemplary embodiments, the digital filter 336 applies a triangular transfer function with linear side slopes 502 and 504 referenced above and below the scaled target frequency ($v_c/N$), as depicted in FIG. 5. Generally the slope 504 is equal to the negative of the slope 502, forming a symmetric transfer function. However, different values may be used. Using a triangular transfer function provides a sharp peak, while attenuating side band frequencies. Performing digital filtering in the frequency domain may simplify filter calculations, as multiplication can be performed rather than time domain convolution. In exemplary embodiments, coefficients for the digital filter 336 are received from the $v_c$ filter data buffer 304 via signal path 338. When the digital filter 336 is applied to the averaged frequency values, the resulting filtered values may be as depicted in FIG. 6. Using a 3-bin approach, the spectral magnitude values in side bins 602 and 604 represent the relative balance or centering of the output frequency ($v_{c\_out}$) relative to the target frequency ($v_c$). The magnitude values of the side bins 602 and 604 of FIG. 6 are referred to as "ac" and "bd" respectively. The value "c" represents the normalized value of the intercept of the frequency bin 402 of FIG. 4 and the transfer function with slope 502 as depicted in FIG. 5. Similarly, the value "d" represents the normalized value of the intercept of the frequency bin 404 of FIG. 4 and the transfer function with slope 504 as depicted in FIG. 5. The resulting digitally filtered output of the digital filter 336 is sent via signal path 340 to the error-signal decision logic 310.

As previously described, the error-signal decision logic 310 determines a frequency offset amount to correct for frequency error of the output frequency ($v_{c\_out}$) relative to the target frequency ($v_c$). Applying the dither modulation frequency ($\pm\delta_d$) to the VCO 314 results in equidistant frequencies as sum and difference values centered about the output frequency ($v_{c\_out}$). As the output frequency ($v_{c\_out}$) is frequency shifted towards the target frequency ($v_c$), the relative magnitude of the side bins 602 and 604 changes. For example, if the side bin 604 with a magnitude "bd" is greater than magnitude "ac" of the side bin 602, then this indicates that the output frequency ($v_{c\_out}$) is less than the target frequency ($v_c$), and the digital correction signal 309 is increased by a predetermined frequency step ($\pm\delta$). Conversely, if the side bin 604 with the magnitude "bd" is less than the magnitude "ac" of the side bin 602, then this indicates that the output frequency ($v_{c\_out}$) is greater than the target frequency ($v_c$), and the digital correction signal 309 is decreased by a predetermined frequency step ($-\delta$). When the side bin 604 with the magnitude "bd" is equal to the magnitude "ac" of the side bin 602, then this indicates that the output frequency ($v_{c\_out}$) is equal to the target frequency ($v_c$), and a frequency lock has been achieved. While a simple plus or minus frequency step ($\pm\delta$) is disclosed, variable step sizes may also be employed to rapidly close the gap between the output frequency ($v_{c\_out}$) and the target frequency ($v_c$). Moreover, the error-signal detection logic 310 may be updatable via the VPD interface function 110 of FIG. 1 to modify frequency step sizes, include an additional frequency offset, establish an initial value for the digital correction signal 309, and other such features.

Also, the filter amplitude transfer function for the digital filter 336 may be other than linear as shown in FIG. 5 but must be monotonic to insure one and only one valid solution.

Figure 7:
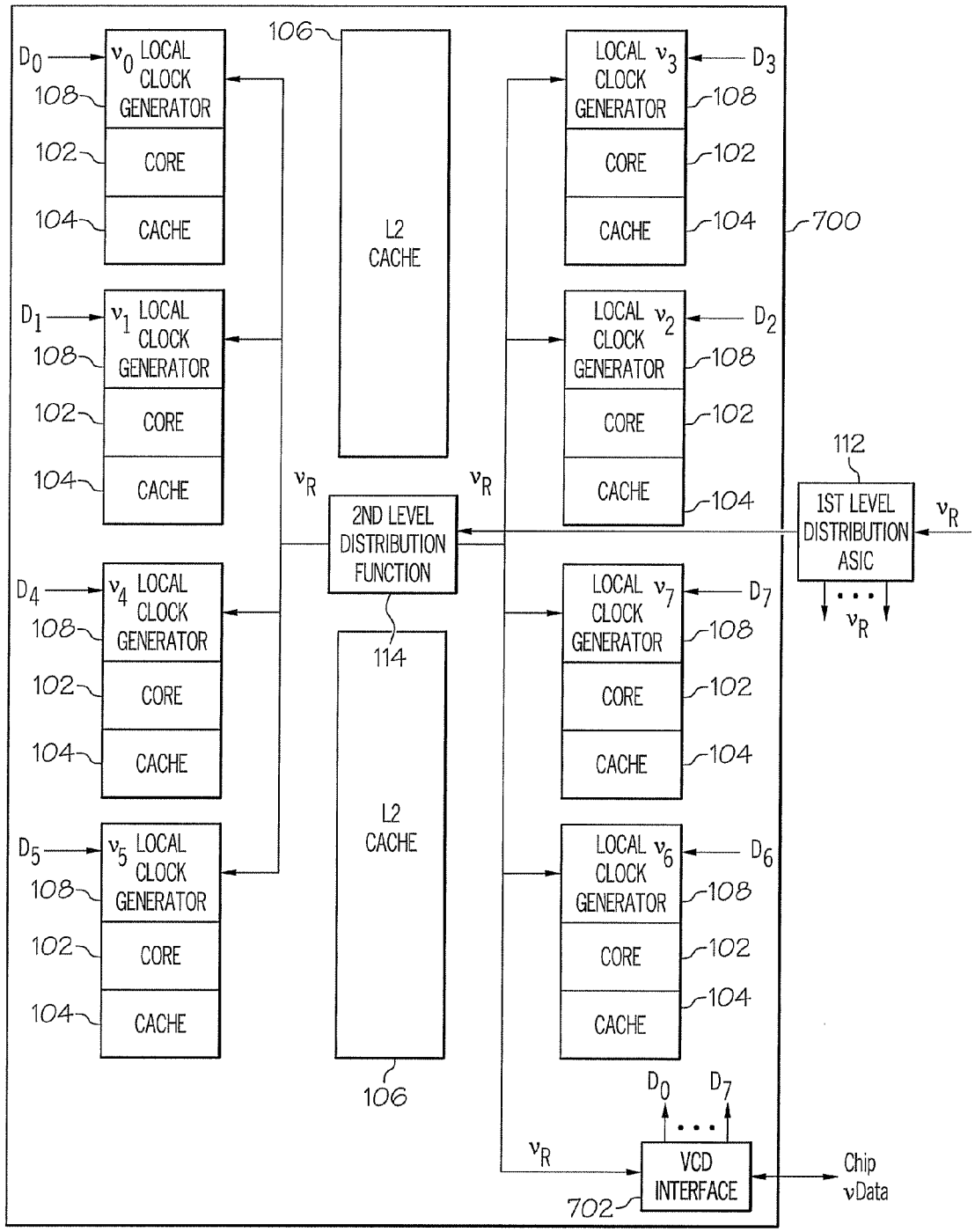
FIG. 7 depicts multi-frequency clocking of an alternate configuration of a multi-core processor chip in accordance with exemplary embodiments.
Figure 8:
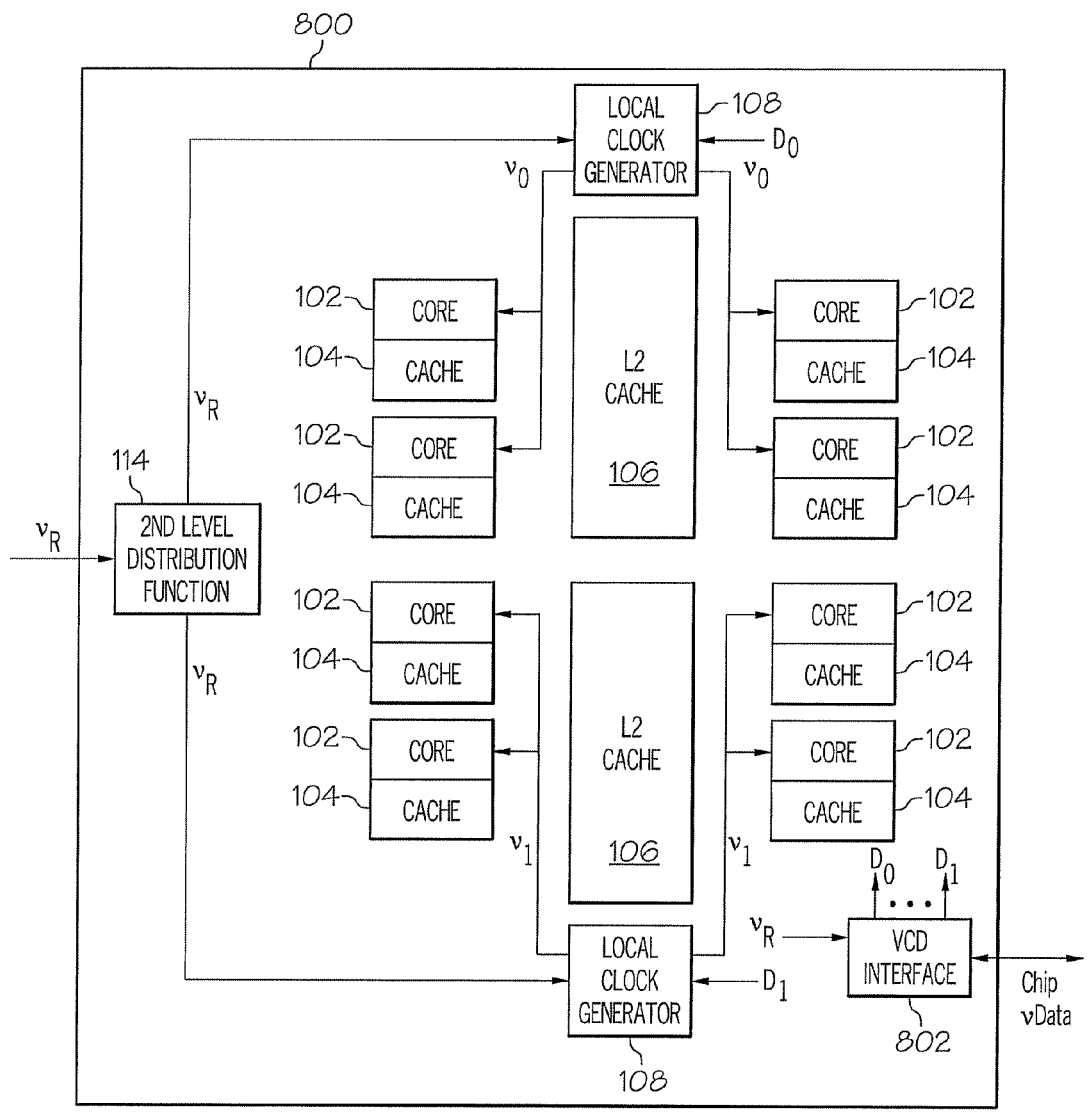
FIG. 8 depicts multi-frequency clocking of a multi-core processor chip sharing a local clock generator for multiple cores in accordance with exemplary embodiments.

FIGS. 7 and 8 depict further possible configurations for clock and data distribution to multiple cores within microprocessor chips 700 and 800. The exemplary μP chip 700 includes a second level distribution function 114 to distribute the reference oscillator clock frequency ($v_R$) received from the first level distribution ASIC 112 to the local clock generators 108. The μP chip 700 includes multiple L2 caches 106 shared between multiple cores 102, as well as local caches 104 and local clock generators 108 paired with each core 102. The μP chip 700 also includes a larger VCD interface function 702 to distribute vData to the eight local oscillators 108 as compared to the VCD interface 110 of FIG. 1. Each of the local clock generators 108 includes an FLL, such as the FLL 200 of FIG. 2 or the FLL 300 of FIG. 3, to generate high frequency core clock output signals $v_0$-$v_7$. It will be understood that the exemplary μP chip 700 represents merely one example of scaling possibilities within a given microprocessor employing the inventive principles disclosed herein.

Similarly, the μP chip 800 depicted in FIG. 8 represents an additional possible exemplary configuration that connects a local clock generator 108 to multiple cores 102. In this example, each core 102 has a corresponding local cache 104 and access to an L2 cache 106. The second level distribution function 114 may be utilized to distribute the reference oscillator clock frequency ($v_R$) to each local clock generator 108. The one-to-many local clock generator 108 to cores 102 configuration of FIG. 8 may be employed in designs where multiple cores 102 are grouped in different regions of the μP chip 800, e.g., north and south areas of the chip, with regional differences significant enough to justify separate local clock generators 108 for each region but not different enough at each core 102 to justify a local clock generator 108 for each core 102. The configuration depicted in FIG. 8 may also be advantageous to lower cost and complexity over the configuration of FIG. 7, while reducing flexibility at the core level. VCD interface 802 may also be reduced in size and complexity as compared to the VCD interface 702 of FIG. 7 and the VCD interface 110 of FIG. 1, since fewer local oscillators 108 are adjusted. Each of the local oscillators 108 may include an FLL, such as the FLL 200 of FIG. 2 or the FLL 300 of FIG. 3, to generate high frequency core clock output signals $v_0$ and $v_1$.

Figure 9:
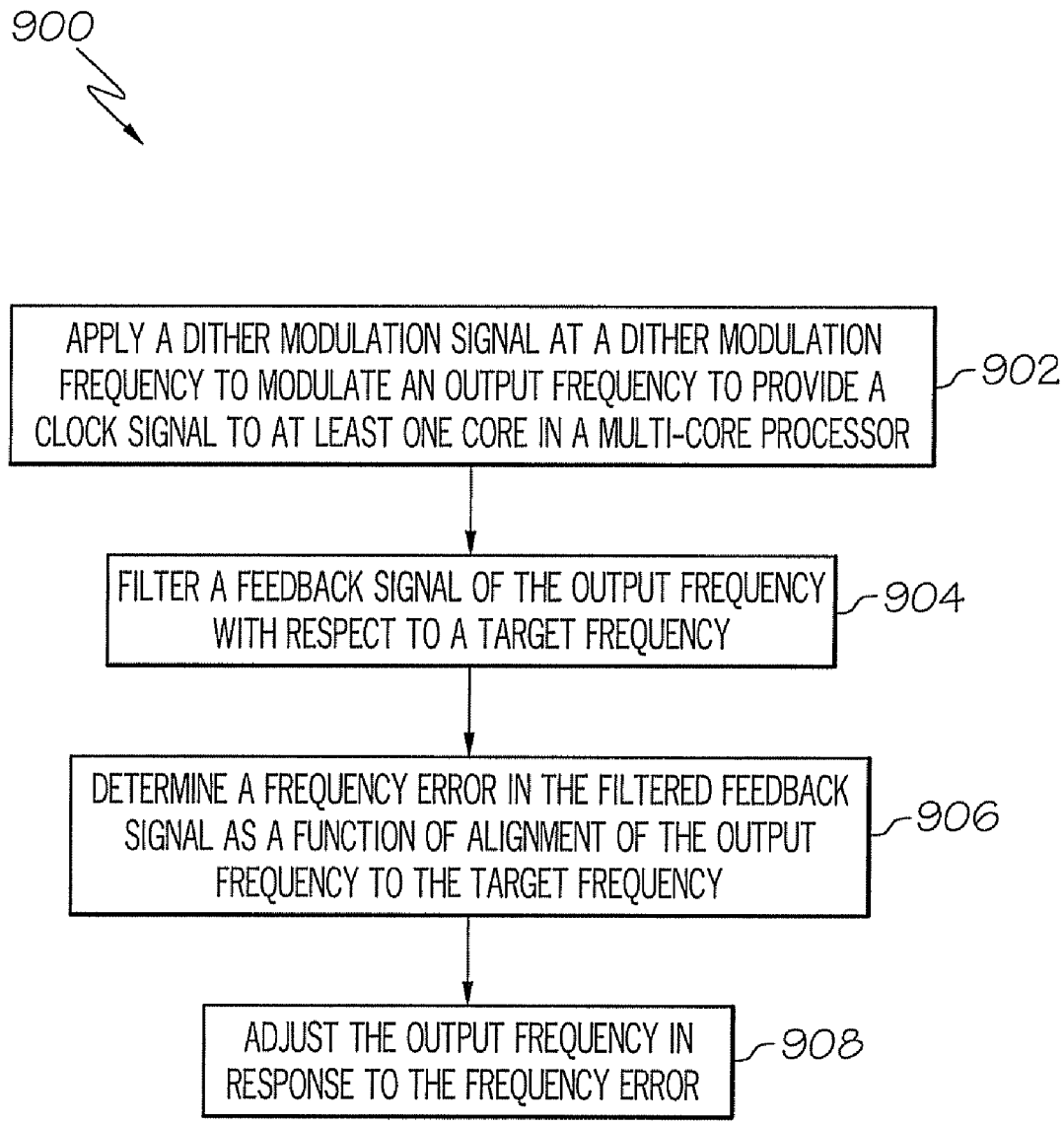
FIG. 9 depicts an exemplary process for digitally controlling a frequency locked loop.

Turning now to FIG. 9, a process 900 for a digital FLL in a multi-core processor, such as the μP chip 100 will now be described in accordance with exemplary embodiments, and in reference to FIGS. 1-6. It will be understood that the process 900 can also be applied to the exemplary μP chips 700 and 800 of FIGS. 7 and 8, as well as additional configurations within the scope of this disclosure. In exemplary embodiments, the μP chip 100 of FIG. 1 receives a reference oscillator clock frequency ($v_R$) at a relatively low frequency, and internally produces multiple high frequency core clocks (e.g., $v_0$-$v_3$) using the local clock generators 108. Each of the local clock generators 108 may employ an FLL with digital signal processing and/or digital control logic, such as the FLLs 200 and 300 of FIGS. 2 and 3. Each FLL 200 and 300 can produce an output frequency ($v_{c\_out}$) that provides the cores 102 with high frequency core clocks (e.g., $v_0$-$v_3$) locked at a target frequency ($v_c$), where the target frequency ($v_c$) may be programmed to provide optimal clocking to one or more specific cores 102.

At block 902, the FLL 200 provides a dither modulation signal 203 at a dither modulation frequency to modulate the output frequency ($v_{c\_out}$), providing a clock signal (e.g., $v_0$-$v_3$) to at least one of the cores 102. Similarly, the FLL 300 can provide a dither modulation signal 307 at a dither modulation frequency to modulate the output frequency ($v_{c\_out}$), providing a clock signal (e.g., $v_0$-$v_3$) to at least one of the cores 102.

At block 904, the FLL 200 filters a feedback signal of the output frequency ($v_{c\_out}$) with respect to the target frequency ($v_c$) using the bandpass filter 208 centered on the target frequency ($v_c$). In contrast, the FLL 300 filters a scaled feedback signal ($v_c$/N) of the output frequency ($v_{c\_out}$) with respect to the target frequency ($v_c$) using the digital filter 336, which may be centered on the target frequency ($v_c$) or the scaled target frequency ($v_c$/N), as depicted in FIG. 5. The scaled target frequency ($v_c$/N) provides equivalent information for determining frequency error, but is down-sampled to reduce computational and A/D conversion rate burdens.

The FLL 300 may perform additional signal processing prior to applying the digital filter 336 to better isolate frequency content of the output frequency ($v_{c\_out}$). For example, the FLL 300 can calculate spectral content of the output frequency ($v_{c\_out}$) to isolate the frequency contribution of the dither modulation frequency, and determine the alignment of the output frequency ($v_{c\_out}$) to the target frequency ($v_c$) as a function of the frequency contribution of the dither modulation frequency. The spectral content may be calculated using the DFT function 324, or other frequency isolation techniques known in the art. Isolating the frequency contribution of the dither modulation frequency as sideband spectra enables application of the digital filter 336 to the sideband spectra to produce filtered sideband spectra or side bins, such as the side bins 602 and 604 of FIG. 6. Further signal processing in the FLL 300 may also be performed to reduce noise effects and adjust data rates, such as using the averaging buffers 328 and 330.

At block 906, the FLL 200 determines a frequency error in the filtered feedback signal 209 as a function of alignment of the output frequency ($v_{c\_out}$) to the target frequency ($v_c$). The frequency error may be determined using the vector cross product function 212 to calculate a vector cross product of the filtered feedback signal 209 and the dither modulation signal 203. Prior to calculating the vector cross product, the filtered feedback signal 209 may be amplified by the amplifier 210 if the signal strength of the filtered feedback signal 209 is low. The lowpass filter 214 and the integrate and digitize function 216 produce an averaged frequency error signal 217 that can be positive or negative depending upon whether there is a misalignment between the target frequency ($v_c$) and the output frequency ($v_{c\_out}$).

In exemplary embodiments, the FLL 300 determines a frequency error in filtered feedback signal 340 as a function of alignment of the output frequency ($v_{c\_out}$) with sidebands depicted in FIG. 4 to the target frequency ($v_c$). The FLL 300 employs error-signal decision logic 310 to compare the filtered sideband spectra relative to each other to determine the alignment.

At block 908, the FLL 200 adjusts the output frequency ($v_{c\_out}$) in response to the frequency error by modifying the bias voltage 204 to reduce the frequency error. The FLL 300 adjusts the output frequency ($v_{c\_out}$) in response to the frequency error using the error-signal decision logic 310. The error-signal decision logic 310 increases the digital correction signal 309 to increase the output frequency ($v_{c\_out}$) when a lower frequency filtered sideband spectral magnitude is less than a higher frequency filtered sideband spectral magnitude (e.g., side bin 602 magnitude "ac"<side bin 604 magnitude "bd"). Conversely, the error-signal decision logic 310 decreases the digital correction signal 309 to decrease the output frequency ($v_{c\_out}$) when the lower frequency filtered sideband spectral magnitude is greater than the higher frequency filtered sideband spectral magnitude (e.g., side bin 602 magnitude "ac">side bin 604 magnitude "bd"). The step size (±δ) used to increase or decrease the digital correction signal 309 may be programmable. The FLL 300 combines the dither modulation signal 307 with the digital correction signal 309 using the combiner 308 to produce the output frequency ($v_{c\_out}$), thus closing the loop and enabling frequency tracking and locking.

Technical effects of exemplary embodiments include digitally controlling FLLs, allowing multiple cores in a multi-core processor chip to run at different optimal frequencies. Further technical effects include supporting a multi-frequency architecture, with a lower frequency system oscillator and higher frequency local oscillators capable of operating independently for clocking different cores of a multi-core processor. Using a digital FLL to directly generate a target clock frequency may result in numerous advantages. Digital FLLs avoid many issues associated with PLLs, such as phase-error nulling, phase-noise, and jitter problems. Further advantages include avoiding false locks on harmonics of a reference frequency, as well as providing a continuous solution that does not require a direct reference to a system oscillator. Using an FLL may eliminate the need for high-speed clock distribution trees, as a slower speed system oscillator can be used to support feedback circuitry, while a local high-speed clock is output from the forward path of the FLL. Using a digital approach may enable multiple digital FLLs to be implemented to support different core frequencies within the same multi-core processor chip. Applying a digital filter to generate an error-signal vector (e.g., magnitude and direction) allows for configurability to shift the target frequency of the FLL for optimizing performance. Digital data further enables decision-logic based on the digital filter function. Placing clock frequency control at the core level may enable accommodation of aging and drift effects, as optimal operating frequencies can change over the service life of a component.

Additional technical effects include inherent electromagnetic interference (EMI) immunity for the FLL. EMI disturbances may interrupt, obstruct, or otherwise degrade or limit the effective performance of circuits, such as a PLL. The FLL improves resistance to interference through spreading energy in a given frequency bandwidth as a frequency lock is achieved. In dithering about a center frequency, a spread spectrum effect reduces spectral density and peak radiated emissions that would otherwise result from using a single frequency without dithering. Therefore, the FLL may be less susceptible to EMI and reduce peak radiated EMI as compared to a PLL. Moreover, the dither modulation included in the FLL eliminates the need for additional circuitry to handle EMI that may be required by prior art systems.

The inventive techniques disclosed herein can be applied to any processing platform that uses multi-core microprocessor chips, for example, servers, client microprocessor platforms, storage controllers, data communication switches, wireless communications devices, high-definition television equipment, and the like, which employ advanced solid-state clocking devices.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for a digital frequency locked loop in a multi-core processor, comprising:
    applying a dither modulation signal at a dither modulation frequency to modulate an output frequency to provide a clock signal to a core of the multi-core processor;
    filtering a feedback signal of the output frequency with respect to a target frequency;
    determining a frequency error in the filtered feedback signal as a function of alignment of the output frequency to the target frequency; and
    adjusting the output frequency in response to the frequency error.

2. The method of claim 1 wherein the frequency error is determined as a function of a vector cross product of the filtered feedback signal and the dither modulation signal.

3. The method of claim 1 further comprising:
    calculating spectral content of the output frequency to isolate frequency contribution of the dither modulation frequency; and
    determining the alignment of the output frequency to the target frequency as a function of the frequency contribution of the dither modulation frequency.

4. The method of claim 3 wherein calculating spectral content is performed using a discrete Fourier transform.

5. The method of claim 3 wherein the frequency contribution of the dither modulation frequency is isolated as sideband spectra.

6. The method of claim 5 wherein filtering the feedback signal of the output frequency is applied to the spectral content of the output frequency, producing filtered sideband spectra.

7. The method of claim 6 wherein determining the frequency error further comprises comparing the filtered sideband spectra relative to each other; and
    adjusting the output frequency further comprises increasing a frequency correction signal to increase the output frequency when a lower frequency filtered sideband spectral magnitude is less than a higher frequency filtered sideband spectral magnitude, and decreasing the frequency correction signal to decrease the output frequency when the lower frequency filtered sideband spectral magnitude is greater than the higher frequency filtered sideband spectral magnitude.

8. The method of claim 1 further comprising:
    receiving digital data defining a transfer function for the filtering via a vital chip data interface, wherein the digital data further includes data to identify the target frequency.

9. The method of claim 1 wherein the dither modulation frequency provides immunity to electromagnetic interference for the digital frequency locked loop.

10. A system for a digital frequency locked loop in a multi-core processor, comprising:
    a dither modulator signal to provide dither modulation at a dither modulation frequency to a voltage bias;

a voltage controlled oscillator receiving the voltage bias and generating an output frequency to provide a clock signal to a core in the multi-core processor; and a feedback path to calculate a frequency error between the output frequency and a target frequency, wherein the voltage bias is modified to compensate for the frequency error.

11. The system of claim 10 further comprising:

a bandpass filter centered on the target frequency to filter the output signal in the feedback path, resulting in a filtered feedback signal.

12. The system of claim 11 further comprising:

a vector cross product function to calculate a vector cross product of the dither modulation frequency and the filtered feedback signal, resulting in a vector cross product signal; and an integrate and digitize function to produce an average frequency error signal from the vector cross product signal, wherein the average frequency error signal provides the frequency error compensation.

13. The system of claim 11 wherein the target frequency is programmable from digital data defining a transfer function for the bandpass filter via a vital chip data interface.

14. A system for a digital frequency locked loop in a multi-core processor, comprising:

a dither modulator to generate a dither modulation frequency;

error-signal decision logic to control mixing a digital correction signal with the dither modulation frequency to produce an output frequency, wherein the output frequency provides a clock signal to a core in the multi-core processor; and a feedback path isolating frequency content of the output signal with respect to a target frequency, wherein the isolated frequency content is input to the error-signal decision logic to reduce frequency error between the output signal and the target frequency.

15. The system of claim 14 wherein isolating frequency content is performed via calculating spectral content of the output frequency, including frequency contribution of the dither modulation frequency.

16. The system of claim 15 wherein calculating spectral content is performed using a discrete Fourier transform.

17. The system of claim 15 wherein the frequency contribution of the dither modulation frequency is isolated as sideband spectra.

18. The system of claim 17 further comprising:

a digital filter to filter the sideband spectra, producing filtered sideband spectra, wherein the error-signal decision logic reduces the frequency error by increasing the digital correction signal to increase the output frequency when a lower frequency filtered sideband spectral magnitude is less than a higher frequency filtered sideband spectral magnitude, and decreasing the digital correction signal to decrease the output frequency when the lower frequency filtered sideband spectral magnitude is greater than the higher frequency filtered sideband spectral magnitude.

19. The system of claim 18 further comprising:

a filter data buffer, wherein the filter data buffer receives digital data defining a transfer function for the digital filter, including the target frequency.

20. The system of claim 14 further comprising:

a switch to disable outputting the output frequency to the core in the multi-core processor.

* * * * *